US008710469B2

(12) United States Patent
Asai et al.

(10) Patent No.: US 8,710,469 B2
(45) Date of Patent: Apr. 29, 2014

(54) ION IMPLANTATION METHOD AND ION IMPLANTATION APPARATUS

(71) Applicant: Nissin Ion Equipment Co., Ltd, Kyoto (JP)

(72) Inventors: Hirofumi Asai, Kyoto (JP); Yoshikazu Hashino, Kyoto (JP)

(73) Assignee: Nissin Ion Equipment Co., Ltd, Kyoto (JP)

( * ) Notice: Subject to any disclaimer, the term of this patent is extended or adjusted under 35 U.S.C. 154(b) by 0 days.

(21) Appl. No.: 14/020,285

(22) Filed: Sep. 6, 2013

(65) Prior Publication Data

US 2014/0004688 A1 Jan. 2, 2014

Related U.S. Application Data

(62) Division of application No. 13/053,624, filed on Mar. 22, 2011, now Pat. No. 8,552,404.

(30) Foreign Application Priority Data

Feb. 2, 2011 (JP) ................................ 2011-020362

(51) Int. Cl.
*G21G 5/00* (2006.01)
(52) U.S. Cl.
USPC ................... 250/492.3; 250/492.1; 250/492.2
(58) Field of Classification Search
USPC .......................................... 250/492.1–492.3
See application file for complete search history.

(56) References Cited

U.S. PATENT DOCUMENTS

| | | | |
|---|---|---|---|
| 6,750,462 B2 | 6/2004 | Iwasawa et al. |
| 7,375,354 B2 | 5/2008 | Iwasawa et al. |
| 7,442,946 B2 | 10/2008 | Lee |
| 7,488,959 B2 | 2/2009 | Jung et al. |
| 7,544,957 B2 | 6/2009 | Walther et al. |
| 7,662,705 B2 | 2/2010 | Rouh et al. |
| 7,825,015 B2 | 11/2010 | Sohn et al. |
| 2005/0184254 A1 | 8/2005 | Matsumoto et al. |
| 2006/0240651 A1 | 10/2006 | Renau et al. |

FOREIGN PATENT DOCUMENTS

| | | | |
|---|---|---|---|
| JP | 2003-132835 A | 5/2003 |
| JP | 2010-118235 A | 5/2010 |

*Primary Examiner* — Michael Maskell
(74) *Attorney, Agent, or Firm* — Procopio, Cory, Hargreaves & Savitch LLP

(57) ABSTRACT

In an ion implantation method, ion implantation into a substrate is performed while changing a relative positional relation between an ion beam and the substrate. A first ion implantation process in which a uniform dose amount distribution is formed within the substrate and a second ion implantation process in which a non-uniform dose amount distribution is formed within the substrate are performed in a predetermined order. Moreover, a cross-sectional size of an ion beam irradiated on the substrate during the second ion implantation process is set smaller than a cross-sectional size of an ion beam irradiated on the substrate during the first ion implantation process.

2 Claims, 11 Drawing Sheets

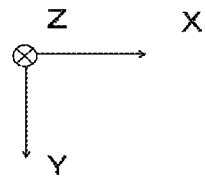

ION IMPLANTATION METHOD AND ION IMPLANTATION APPARATUS

CROSS REFERENCE TO RELATED APPLICATIONS

This is a divisional application of U.S. application Ser. No. 13/053,624 filed Mar. 22, 2011, which claims priority from Japanese Patent Application No. 2011-020362, filed on Feb. 2, 2011. The entire disclosure of U.S. application Ser. No. 13/053,624 and Japanese Patent Application No. 2011-020362 are each incorporated herein in entirety by reference.

BACKGROUND OF THE INVENTION

1. Field of the Invention

The present invention relates to an ion implantation method and an ion implantation apparatus capable of forming a non-uniform distribution of a dose amount within a substrate.

2. Description of the Related Art

Ion implantation process is one of the manufacturing processes of a semiconductor substrate. In the ion implantation process, ion implantation is sometimes performed such that a distribution of an ion implantation amount (also referred to as a dose amount) that is implanted within a substrate (for example, a wafer or a glass substrate) is non-uniform.

For example, in the manufacturing process of the semiconductor substrate, there is a problem that characteristics of a semiconductor device that is manufactured on a one substrate become non-uniform within the substrate.

To compensate for such a non-uniform distribution of the characteristics of the semiconductor device, conventionally, a method is used by which a dose amount implanted within the substrate in the ion implantation process is non-uniformly distributed within the substrate.

A concrete method is disclosed in Patent Document 1. Patent Document 1 discloses an ion implantation apparatus that realizes implantation of ions into the substrate by reciprocally driving the substrate in a Y direction, and scanning a spot-like ion beam in an X direction that is orthogonal to the Y direction by virtue of an electric field or a magnetic field. Such an ion implantation apparatus is called a hybrid scanning system. With such an ion implantation apparatus, a non-uniform dose amount distribution can be formed within the substrate by changing a scanning speed of the ion beam depending on a position of the ion beam on the substrate.

Moreover, in the manufacturing process of the semiconductor substrate, to improve a utilization efficiency of the substrate, a technique has been used from the past in which a semiconductor device having different characteristics is manufactured in different regions on a single substrate. An example of such a technique is disclosed in Patent Document 2.

In Patent Document 2, ion implantation into the substrate is performed using the ion implantation apparatus of the hybrid scanning system similar to Patent Document 1. First, to form distribution of two different dose amounts on either side of a center portion of the substrate, ion implantation into the substrate is performed by changing either the scanning speed of the ion beam or a driving speed of the substrate to a different value when the ion beam crosses the center portion of the substrate. Subsequently, the substrate is rotated by 90 degrees and the ion implantation is performed by changing either the scanning speed of the ion beam or the driving speed of the substrate to a different value when the ion beam again crosses the center portion of the substrate. In this manner, four regions having different dose amount distributions are formed in the substrate.

Patent Document 1: Japanese Patent Application Laid-open No. 2010-118235 (FIGS. 3 to 10 and FIGS. 12 to 18)
Patent Document 2: Japanese Patent Application Laid-open No. 2003-132835 (FIGS. 1 to 10, Paragraphs 0062 to 0064, and 0096).

As described in Paragraphs 0062 to 0064 and 0096 of Patent Document 2, changing the scanning speed of the ion beam or the driving speed of the substrate to a desired value takes time; however, short. If the ion beam is irradiated on the substrate while the speed is being changed to the desired speed, a region of an undesired dose amount distribution called a transition region is formed in the substrate.

FIG. 11 depicts states of the transition region. (A) depicts an intended dose amount distribution to be formed beneath the surface of the substrate. In (A), a concentric dose amount distribution is explained as an example. It is an objective to form a region of a dose amount D2 at a central region and a region of a dose amount D1 at an outer circumferential region. (B) depicts a state of the dose amount distribution when the substrate is cut along a line A-A shown in (A). An axis of abscissa shown in each of the graphs (B) to (E) of FIG. 11 indicates a position on the line A-A. The line A-A shown in FIG. 11 at (A) and (F) passes through a center of the substrate and divides the substrate into two portions.

In this example, for the sake of simplicity, a current density of the ion beam and the driving speed of the substrate are always assumed to be constant in the ion implantation apparatus of the hybrid scanning system. In this case, the dose amount implanted into the substrate is inversely proportional to the scanning speed of the ion beam. Therefore, to obtain the dose amount distribution shown in (B), it is necessary to change the scanning speed of the ion beam in the manner shown in (C).

However, because some time is required for changing the scanning speed, the scanning speed of the ion beam is actually changed in the manner shown in (D). As a result, the dose amount distribution shown in (E) is formed on the line A-A. In the dose amount distribution finally formed within the substrate, a transition region R is formed in a region other than the regions of the dose amounts D1 and D2 shown in (F).

A larger transition region leads to insufficient compensation of the characteristics distribution of the semiconductor device. Thus, it is desirable that the transition region be as small as possible. In Patent Document 2, a technique of reducing a size of the ion beam is proposed for making the transition region smaller. Concretely, to change the scanning speed of the ion beam scanned in the X direction at the center portion of the substrate, Wx that is a size of the ion beam in the X direction, is reduced. When the size of the ion beam is reduced, a beam current reduces by an equivalent amount. Therefore, if the ion implantation process to the substrate is performed using such an ion beam, a longer time is required for achieving a desired dose amount distribution. To solve this problem, a method is proposed in which Wy that is a size of the ion beam in the Y direction, which is orthogonal to the X direction, is increased and reduction of the beam current of the ion beam is restrained by performing the ion implantation process using the ion beam that is roughly elliptical.

However, even if an elliptical ion beam proposed in Patent Document 2 is used for forming a circular dose amount distribution on the substrate as mentioned in Patent Document 1 or shown in FIG. 11, the time required to perform the ion implantation process cannot be shortened while reducing the transition region and restraining reduction in the beam current.

In the circular dose amount distribution mentioned in Patent Document 1 or shown in FIG. 11, the dose amount distribution changes in the Y direction when the ion beam is scanned on the substrate in the X direction. As a result, because it is necessary to make the transition region smaller even in the Y direction, it is not sufficient to use only the elliptical ion beam as proposed in Patent Document 2.

SUMMARY OF THE INVENTION

The present invention has been achieved to solve at least the above problems. An object of the present invention is to provide an ion implantation method and an ion implantation apparatus by which a smaller transition region with an undesired dose amount distribution can be obtained as well as the time required for an ion implantation process can be shortened regardless of a shape of a non-uniform dose amount distribution formed beneath a surface of a substrate.

In an ion implantation method according one aspect of the present invention in which ion implantation to the substrate is performed while changing a relative positional relation between the ion beam and the substrate, a first ion implantation process by which a uniform dose amount distribution is formed within the substrate, and a second ion implantation process by which a non-uniform dose amount distribution is formed within the substrate are performed in a predetermined order. Furthermore, a crosssectional size of the ion beam that is irradiated on the substrate during the second ion implantation process is set smaller than a cross-sectional size of the ion beam that is irradiated on the substrate during the first ion implantation process.

Thus, because the non-uniform dose amount distribution is formed within the substrate by combining the ion implantation process that uses the ion beam having a larger cross-sectional size and the ion implantation process that uses the ion beam having a smaller crosssectional size, not only the transition region formed on the substrate can be made sufficiently small, but also the time required for the ion implantation process can be shortened.

When processing a plurality of substrates using the first and second ion implantation processes, it is desirable to successively perform one of the ion implantation processes on the substrates, and thereafter, the other ion implantation process is successively performed on the substrates.

When the structure described above is used, when changing operating parameters of the ion implantation apparatus for the first and second ion implantation processes, the operating parameters can be changed at one time. Thus, because there is no need to take into consideration a waiting time until the ion implantation apparatus is re-operated due to change in the operating parameters, the time for completing the ion implantation process can be shortened by an equivalent time.

An ion implantation apparatus, which performs ion implantation into a substrate while changing a relative positional relation between the ion beam and the substrate, includes a control device including a function that exerts control to perform a first ion implantation process in which a uniform dose amount distribution is formed within the substrate and a second ion implantation process in which a non-uniform dose amount distribution is formed within the substrate in a predetermined order, and sets a cross-sectional size of an ion beam that is irradiated on the substrate during the second ion implantation process smaller than a cross-sectional size of an ion beam that is irradiated on the substrate during the first ion implantation process.

When processing a plurality of the substrates using the first and second ion implantation processes, it is desirable that the control device includes a function that exerts control to select and successively perform one of the ion implantation processes on the substrates, and thereafter, successively perform the other ion implantation process on the substrates.

If the ion implantation apparatus is structured as described above, advantages similar to the ion implantation method described above can be obtained.

Furthermore, a structure of the ion implantation apparatus described below can be adopted. That is, the ion implantation apparatus may include a beam shaping mask that shapes the ion beam irradiated on the substrate. It is desirable that the control device includes a function that adjusts a position of the beam shaping mask depending on which one of the first and second ion implantation processes is to be performed.

If the beam shaping mask is used as described above, the cross-sectional size of the ion beam can be easily adjusted.

According to the present invention, a transition region having an undesired dose amount distribution can be made smaller and the time required to perform the ion implantation process can be shortened regardless of a shape of a non-uniform dose amount distribution formed within the substrate.

DETAILED DESCRIPTION OF THE PREFERRED EMBODIMENTS

Exemplary embodiments of an ion implantation method and an ion implantation apparatus according to the present invention are explained below with reference to the accompanying drawings. Directions of X, Y, and Z axes shown in the accompanying drawings are orthogonal to each other. The Z direction indicates a traveling direction of an ion beam and the X direction indicates a scanning direction of the ion beam.

Figure 1:
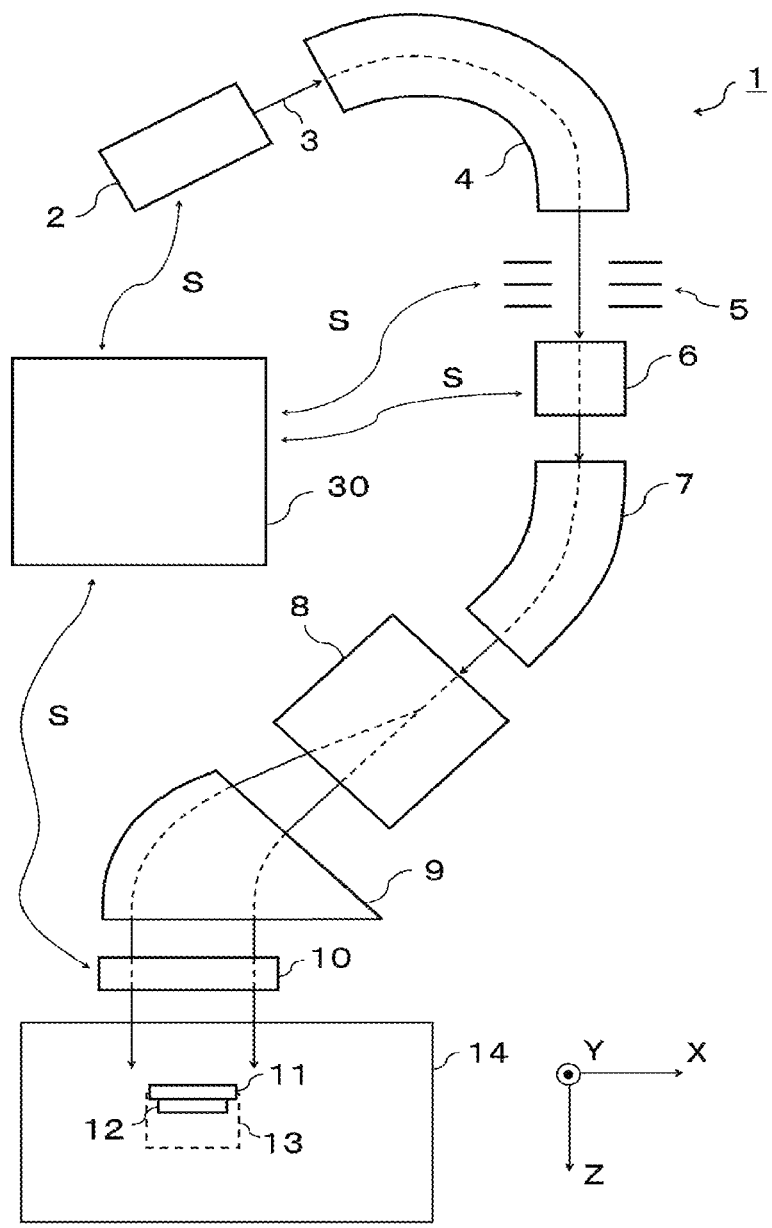
FIG. 1 is a plan view that depicts an example of an ion implantation apparatus according to the present invention.

FIG. 1 is a drawing that depicts an example of an ion implantation apparatus 1 according to the present invention. The X, Y, and Z axes shown in FIG. 1 indicate directions inside a processing chamber 14 that is described later. The ion implantation apparatus 1 is an ion implantation apparatus of a so-called hybrid scanning system, and includes functions that are equivalent to those of ion implantation apparatuses disclosed in Patent Documents 1 and 2.

A structure of each unit is briefly explained below. A spot-like ion beam 3 emitted from an ion source 2 is deflected by a mass analysis magnet 4 and ions of only desired components are extracted from the ion beam 3 at an analysis slit (not shown). Thereafter, the ion beam 3 passes through an acceleration tube 5, and is converted into the ion beam 3 having desired energy.

After passing through the acceleration tube 5, the ion beam 3 is shaped by a quadrupole lens 6 and incident on an energy separator 7. The energy separator 7 is made of an electromagnet in the same manner as the mass analysis magnet 4. The energy separator 7 deflects the ion beam 3 by a predetermined deflection amount and separates neutral particles or unnecessary energy components from the ion beam 3.

A scanner 8 scans the ion beam 3 by virtue of a magnetic field or an electric field in the X direction such that the ion beam 3 wider than a width of a substrate 11 in the X direction.

The ion beam 3 that is scanned by the scanner 8 is deflected by a collimator magnet 9 such that an outer shape of the ion beam 3 is parallel to the Z direction. Thereafter, the ion beam 3 passes through a beam shaping mask 10, and is irradiated on the substrate 11 placed inside the processing chamber 14.

The substrate 11 is held on a platen 12 by electrostatic adsorption, and the platen 12 is coupled to a scanning shaft (not shown) that extends along the Y direction. A motor is provided in a driving device 13. The motor causes reciprocal driving of the scanning shaft along the Y direction, thus causing the ion beam 3 to be irradiated on the entire surface of the substrate 11.

A control device 30 is provided in the ion implantation apparatus 1. The control device 30 includes a function that controls various power supply units. To adjust a cross-sectional size of the ion beam 3 that is irradiated on the substrate 11, the control device 30 exchanges electric signals (S), in a wired or wireless manner, between the power supply units included in each of the driving devices of, for example, the ion source 2, the acceleration tube 5, the quadrupole lens 6, and the beam shaping mask 10. The power supply units described above are controlled by the control device 30 by way of switching between a first ion implantation process and a second ion implantation process that are described later.

Apart from the function described above, the control device 30 can also include a function that controls the scanning speed of the ion beam 3 scanned by the scanner 8 and a driving speed at which the substrate 11 is driven, or a function that controls other optical elements (mass analysis magnet 4, energy separator 7, etc.). Furthermore, the control device 30 can also include a function that places the substrate 11, which is transported in the processing chamber 14 by a transport mechanism (not shown), at a predetermined implantation position, or a function that removes the substrate 11 from the implantation position and transports it to the outside of the processing chamber 14. A second control device can be provided in the ion implantation apparatus 1 and a function that controls the scanner 8, etc., described above can be provided in the second control device. When the second control device is provided, an arrangement is made such that electric signals can be communicated between the two control devices and a relation is established such that one control device can control the other control device.

As disclosed in Patent Document 2, if the object is to make a transition region smaller, then it is sufficient to reduce a size of the ion beam 3 that is irradiated on the substrate 11. However, when the size of the ion beam 3 is reduced without changing current density of the ion beam 3, more time is required to form a desired non-uniform dose amount distribution within the substrate 11. On the other hand, when the size of the ion beam 3 is increased without changing current density of the ion beam 3, the desired non-uniform dose amount distribution within the substrate 11 can be achieved in a shorter time; however, the transition region becomes larger.

Figure 2:
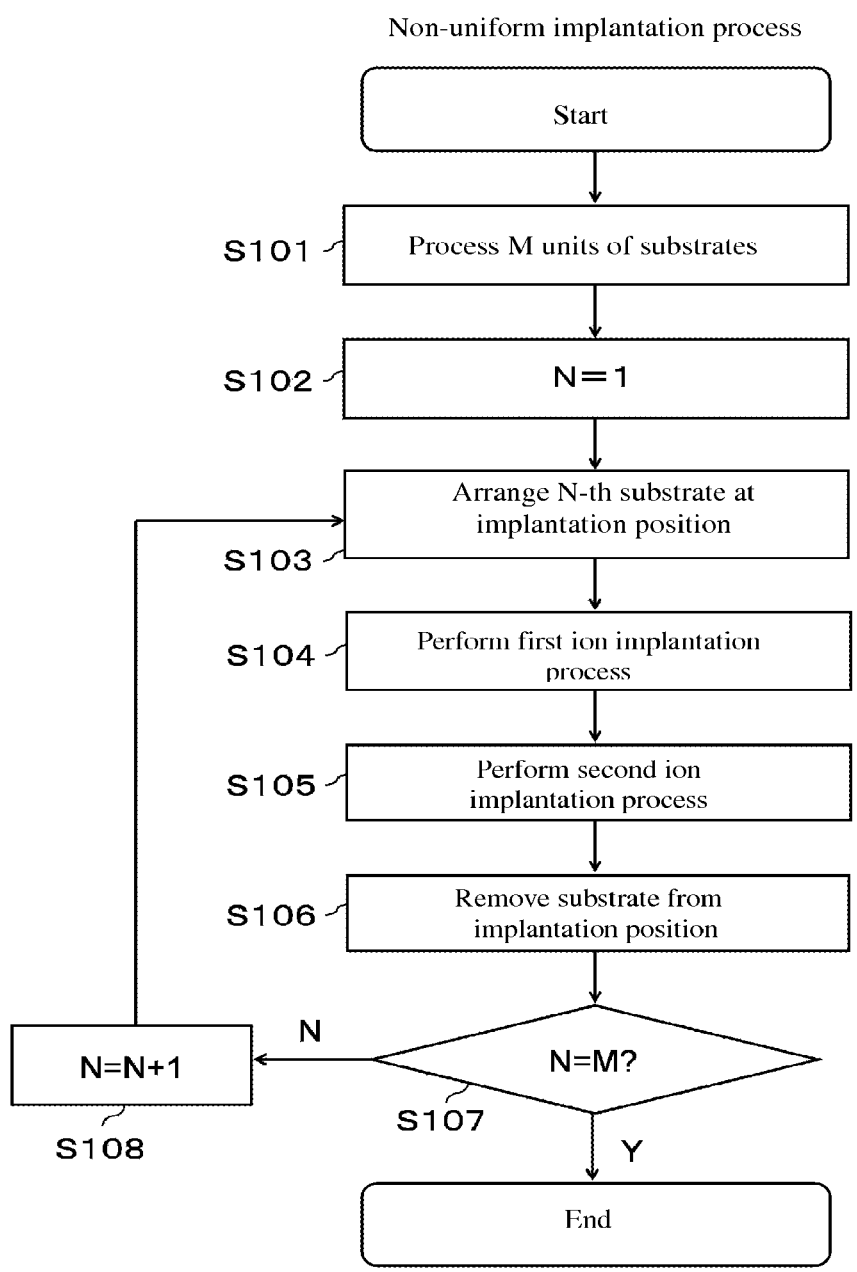
FIG. 2 is a flowchart of an example of a nonuniform implantation process according to the present invention.

Considering the points described above, ion implantation processes of two types are performed in the present invention using ion beams of different crosssectional sizes that are irradiated on the substrate. FIG. 2 is a flowchart explaining an example of a non-uniform implantation process according to the present invention. The non-uniform implantation process is explained in detail below.

In the flowchart shown in FIG. 2, a process is explained in which a substrate is arranged one by one at an implantation position, and the first and second ion implantation processes are successively performed (S101-S105). More specifically, at S101, the number of substrates to be processed is decided in the non-uniform implantation process. M units of substrates are processed, and at S102, N is set to be equal to 1. At S103, the N-th substrate is arranged at an implantation position. Further, at S104, a first ion implantation process is performed, followed by a second ion implantation process at S105. Thereafter, the processed substrate is removed from the implantation position (S106), and it is determined whether the counter N has reached a value of M at S107. If no, then the counter is increased by N=N+1 at S108, and the series of processes is repeated until all the substrates are processed (S103-S108).

In the first ion implantation process, a uniform ion implantation process is performed within the substrate 11 using an ion beam of a large cross-sectional size. Subsequently, in the second ion implantation process, a non-uniform ion implantation process is performed within the substrate 11 using an ion beam of a smaller crosssectional size than the ion beam used in the first ion implantation process. The dose amount distribution finally formed within the substrate is a combination of the dose amount distributions formed by the first and second ion implantation processes. The term "uniform" implies that the value of the dose amount is substantially constant within the entire substrate and the term "non-uniform" implies that the value of the dose amount is not constant within the entire substrate.

By combining the dose amount distributions formed by the different ion implantation processes, the transition region can be made smaller and the desired non-uniform dose amount distribution can be formed within the substrate 11 in a shorter time. The example in which the second ion implantation process is performed subsequent to the first ion implantation process is explained here; however, this sequence can be reversed. That is, the first ion implantation process can be performed subsequent to the second ion implantation process.

Figure 3A:
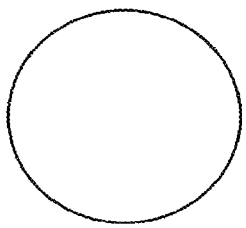
FIGS. 3A to 3D are drawings that depict a relation of cross-sectional sizes of an ion beam that is irradiated on a substrate in a first ion implantation process and a second ion implantation process of the present invention.
Figure 3B:
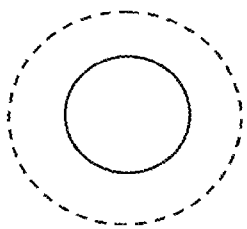
Figure 3C:
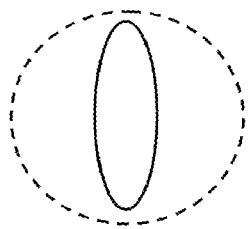
Figure 3D:
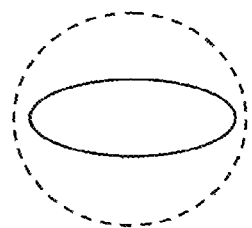

FIGS. 3A to 3D are drawings that depict examples that show a relation of cross-sectional sizes of the ion beam that is irradiated on the substrate in the first and second ion implantation processes. FIG. 3A is a drawing that depicts a cross-sectional shape of the ion beam 3 used in the first ion implantation process. In FIGS. 3B to 3D, an outline of the ion beam 3 used in the first ion implantation process is shown by a dashed line. A solid line shown in FIGS. 3B to 3D depicts a cross-sectional shape of the ion beam 3 used in the second ion implantation process.

In the present invention, the cross-sectional size of the ion beam 3 used in the second ion implantation process is smaller than the cross-sectional size of the ion beam 3 used in the first ion implantation process. A magnitude relation of the cross-sectional sizes is as follows. When the cross-sectional shape of the ion beam 3 irradiated on the substrate 11 is considered, the crosssectional shape of the ion beam 3 used in the second ion implantation process falls within the cross-sectional shape of the ion beam 3 used in the first ion implantation process. In this manner, the cross-sectional size of the ion beam 3 used in the second ion implantation process is smaller than the cross-sectional size of the ion beam 3 used in the first ion implantation process.

More specifically, as shown in FIGS. 3B to 3D, the cross-sectional shape (dashed line) of the ion beam used in the first ion implantation process encloses the cross-sectional shape (solid line) of the ion beam used in the second ion implantation process.

Figure 4:
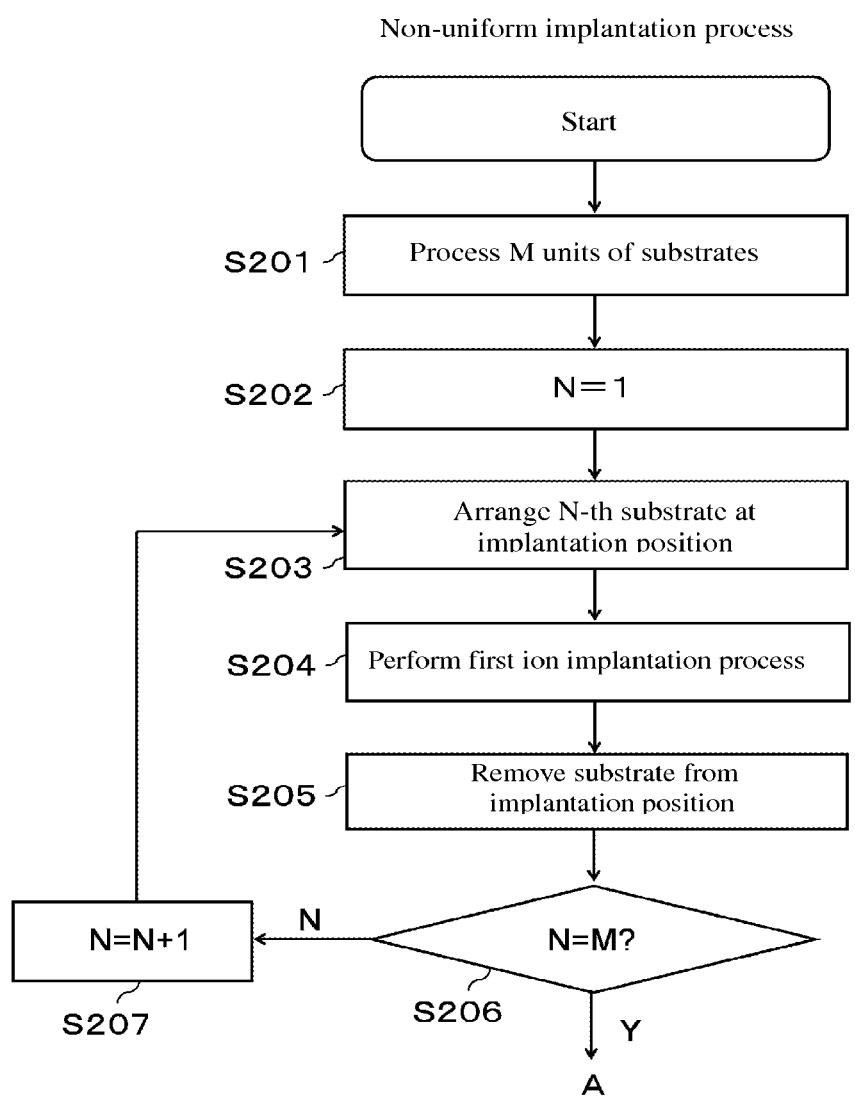
FIG. 4 is a flowchart of another example of a non-uniform implantation process according to the present invention that continues to A in FIG. 5.
Figure 5:
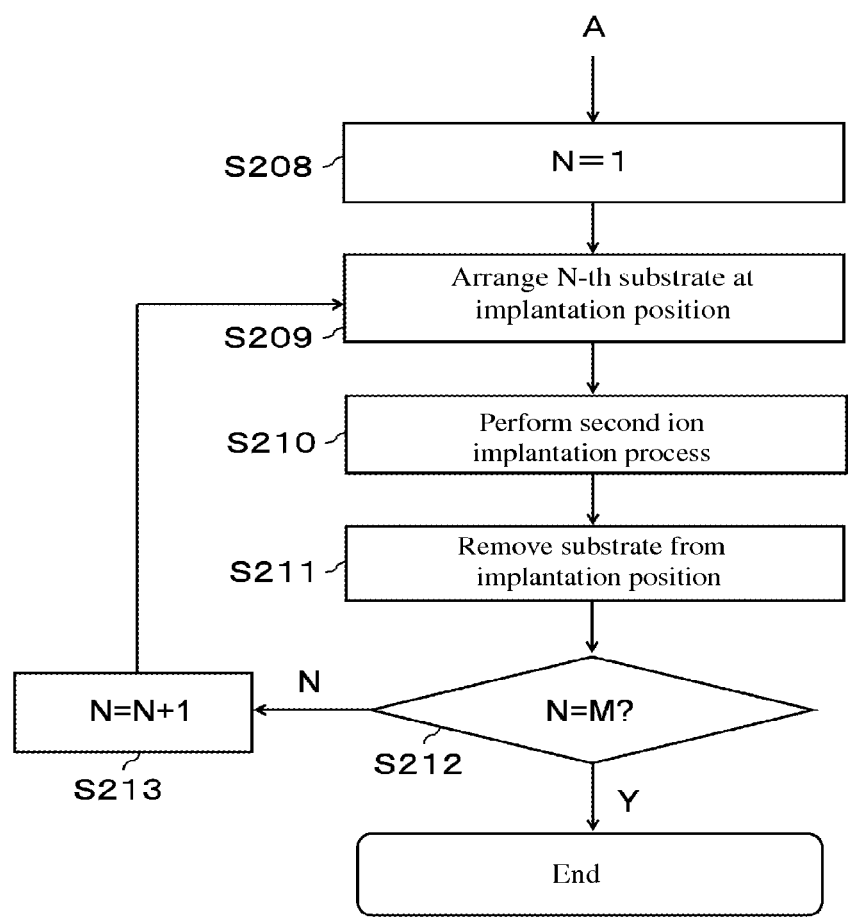
FIG. 5 is the flowchart of the other example of the non-uniform implantation process according to the present invention, that is continued from A shown in FIG. 4.

FIGS. 4 and 5 are flowcharts explaining another example of the non-uniform implantation process according to the present invention. The example shown in FIGS. 4 and 5 differs from the example shown in FIG. 2 in that the first ion implantation process is successively performed on a plurality of the substrates (S201-S207), More specifically, at S201, the number of substrates to be processed is decided in the non-uniform implantation process. M units of substrates are processed, and at S202, N is set to be equal to 1. At S203, the N-th substrate is arranged at an implantation position. Further, at S204, a first ion implantation process is performed. Thereafter, the processed substrate is removed from the implantation position at S205, and it is determined whether the counter N has reached a value of M at S206. If no, then the counter is increased by N=N+1 at S207, and the series of processes is repeated until all the substrates are processed. And thereafter, the second ion implantation process is successively performed on the substrates (S208-S213). More specifically, at 208, N is set to be equal to 1. At S209, the N-th substrate is arranged at an implantation position. Further, at S210, a second ion implantation process is performed. Thereafter, the processed substrate is removed from the implantation position at S211, and it is determined whether the counter N has reached a value of M at S212. If no, then the counter is increased by N=N+1 at S213, and the series of processes is repeated until all the substrates are processed. Similar to the example given in FIG. 2, the order of execution of the first ion implantation process and the second ion implantation process can be reversed.

In the ion implantation process, operating parameters of the ion source 2 and various magnets of the ion implantation apparatus 1 are changed when the crosssectional size of the ion beam 3 changes. For example, in the example shown in FIG. 2, the operating parameters should be changed at least between each implantation process every time a substrate is processed. Extra time is required when processes such as checking whether the ion beam 3 having the desired cross-sectional size is irradiated on the substrate 11 and correcting values of the operating parameters if the ion beam 3 does not have the desired cross-sectional size are performed after the operating parameters are changed.

In view of this fact, as shown in FIGS. 4 and 5, shortening of the time required for the ion implantation process can be anticipated by successively performing each ion implantation process for a plurality of the substrates. Here, a plurality of the substrates implies, for example, substrates in a lot.

Figure 6:
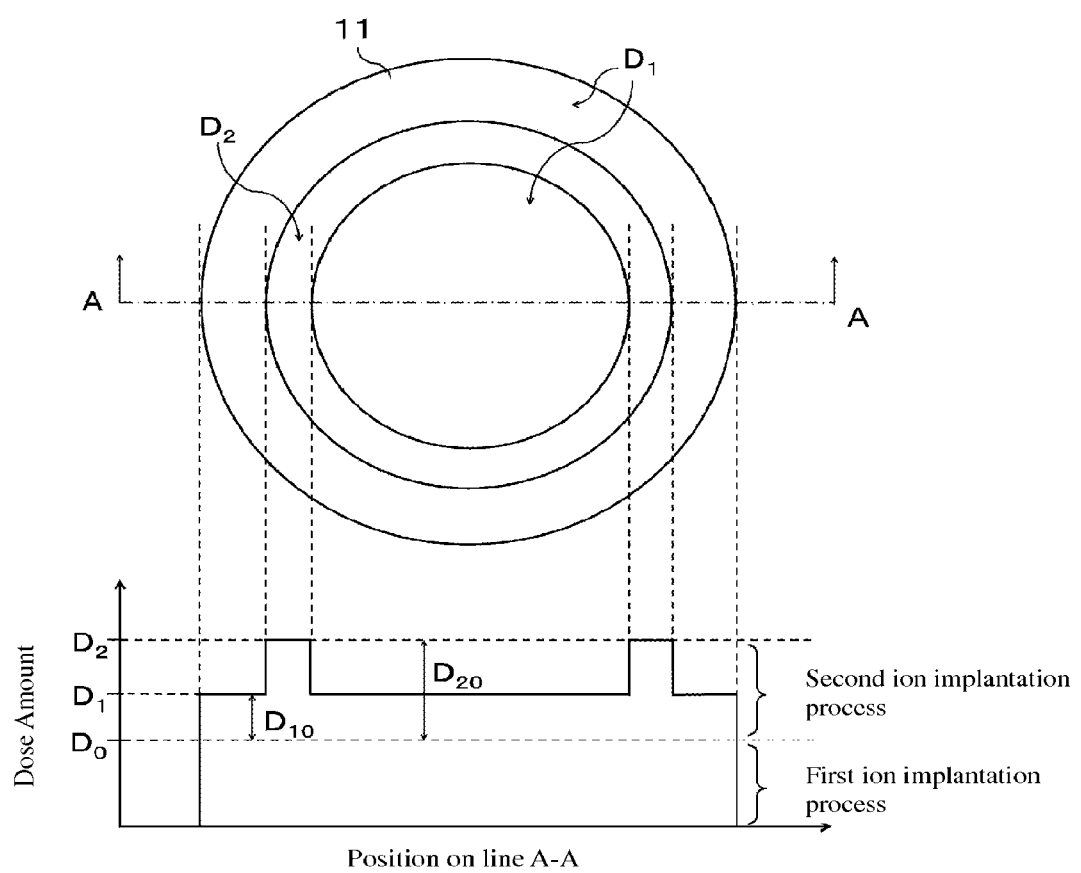
FIG. 6 is a drawing that depicts an example of a non-uniform dose amount distribution formed beneath a surface of the substrate using the first and second ion implantation processes of the present invention.

FIG. 6 is a drawing that depicts an example of a non-uniform dose amount distribution formed within the substrate 11 using the first and second ion implantation processes of the present invention. Regions with high dose amounts forming a substantially ring shape are formed in a portion of the substrate 11.

For example, uniform ion implantation of a dose amount Do is performed within the entire substrate 11 by the first ion implantation process. Thereafter, the scanning speed of the ion beam 3 and the driving speed of the substrate 11 are controlled according to the position of the ion beam 3 on the substrate 11 so as to implant a dose amount 0 10 or a dose amount 0 20 in predetermined regions.

Figure 7:
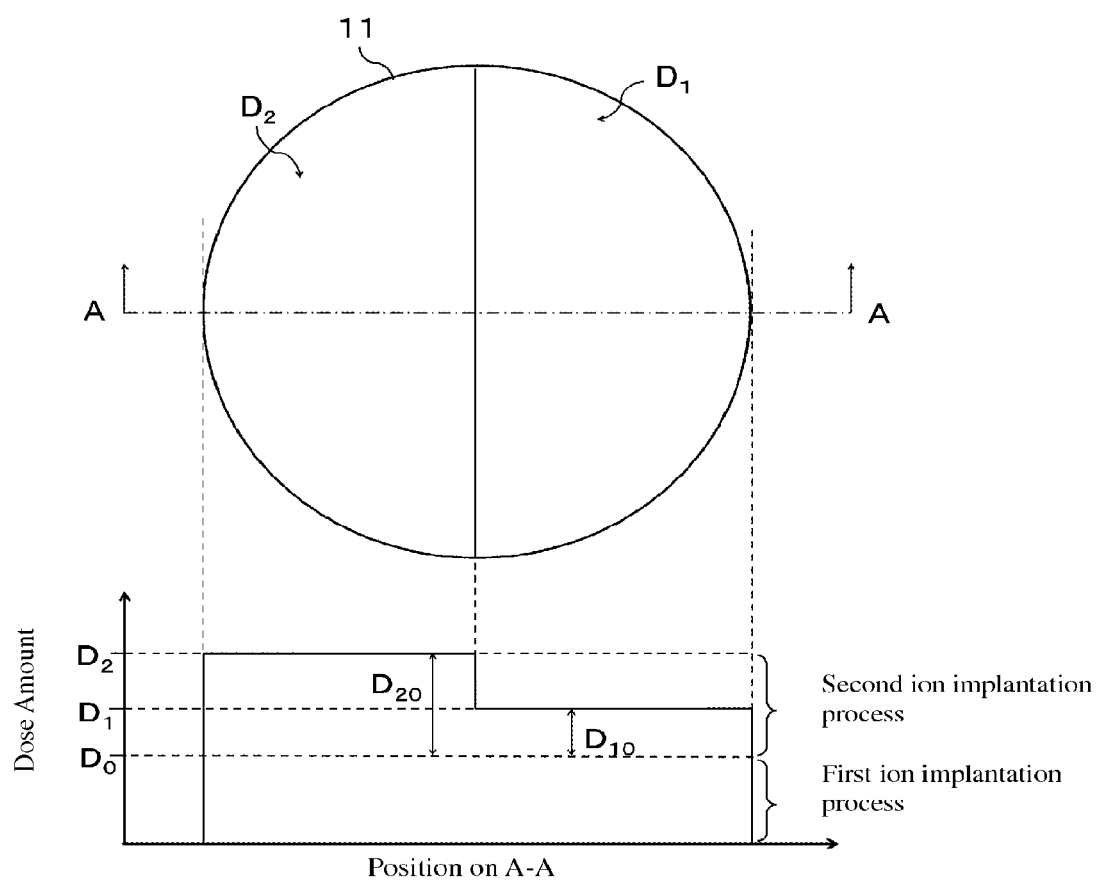
FIG. 7 is a drawing that depicts another example of the non-uniform dose amount distribution formed within the substrate using the first and second ion implantation processes of the present invention.

FIG. 7 is a drawing that depicts a state in which regions of different dose amounts are divided into two regions at a center portion of the substrate 11. Although the dose amount distribution is formed as shown in FIG. 7, the non-uniform dose amount distribution including a small transition region can be formed within the substrate 11 within a shorter time by performing the two ion implantation processes similar to the ion implantation processes performed for the dose amount distribution shown in FIG. 6.

How much dose amount is to be implanted in the first and second ion implantation processes when implanting the ions to the substrate 11 is determined in the manner as explained below.

In FIGS. 6 and 7, focus is trained on the dose amount implanted in the second ion implantation process. What will be the percentage of a high dose amount portion (dose amount D20) relative to a low dose amount portion (dose amount D10) (called dose ratio and expressed by X in Equation 1) is expressed by the following Equation 1:

$$X=(D_{20}/D_{10})-1 \qquad (1)$$

Equation 1 can be modified to Equation 2:

$$X=(D_2-D_0/D_1-D_0)-1 \qquad (2)$$

Equation 2 can be further modified to Equation 3:

$$D_0=(1/X)(D_1-D_2)+D_1 \qquad (3)$$

The dose ratio X is used to determine how much transition region is allowable when the characteristics of a semiconductor device are compensated, or to determine a range of a value that is allowable based on conditions of response characteristics, etc. when changing the scanning speed of the ion beam 3 or the driving speed of the substrate 11 included in the ion implantation apparatus 1.

It is desirable to select a value that is a maximum nearest value within the allowable range as the dose ratio X for shortening the time required for the ion implantation processes. This is because, as the dose ratio X increases, a large amount of ion implantation is performed by the first ion implantation process. When performing implantation of the same dose amount without changing current density of the ion beam 3, between the first ion implantation process using the ion beam 3 of the large cross-sectional size and the second ion implantation process using the ion beam 3 of the small cross-sectional size, the time required for implantation performed using the first ion implantation process is shorter. Thus, to shorten the time required for the entire implantation process, it is desirable to perform ion implantation by the first ion implantation process for as long as possible.

Considering the points described above, if an optimum value of the dose ratio X is determined, because the dose amounts D1 and D2 are known values determined based on the desired non-uniform dose amount distribution, a value of the dose amount Do that should be implanted by the first ion implantation process can be determined. The first ion implantation process is performed using the determined dose amount $D_0$.

Various methods could be considered for adjusting the cross-sectional size of the ion beam. Some concrete examples are explained below.

Figure 8:
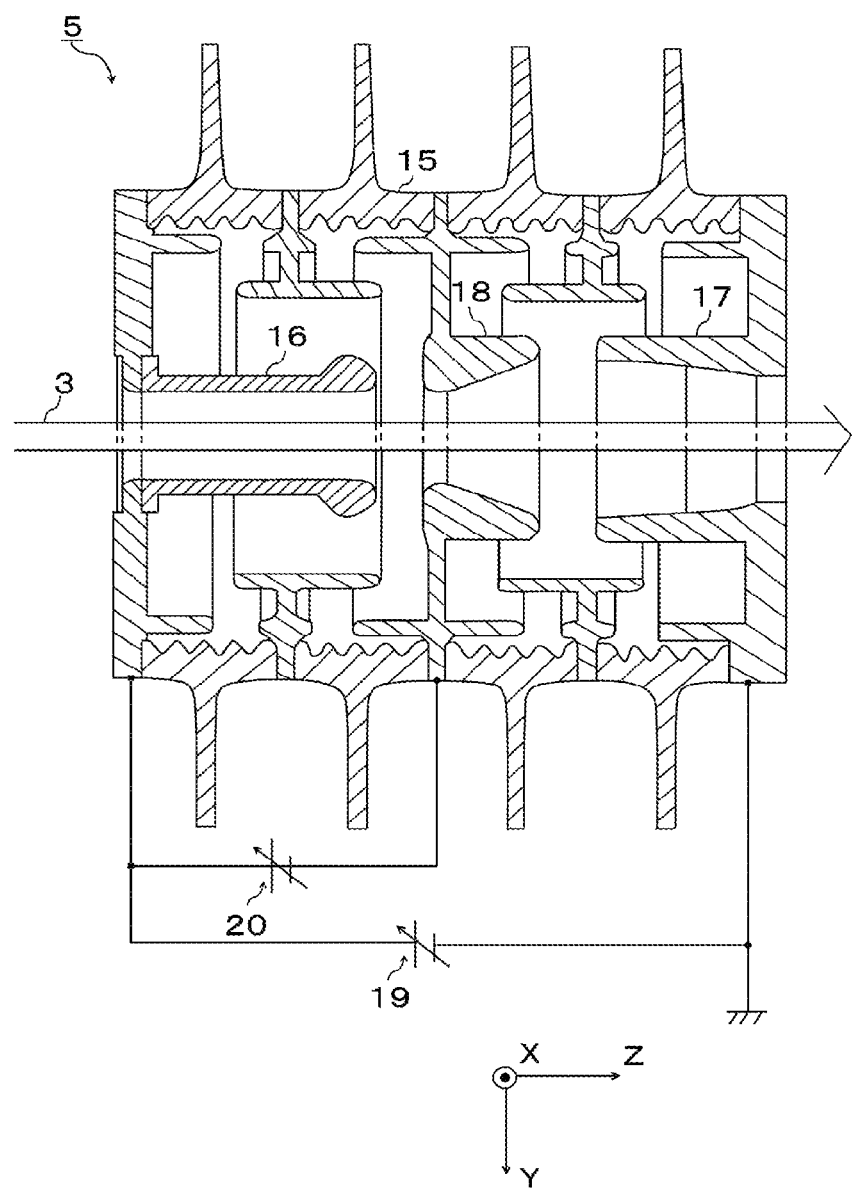
FIG. 8 is a drawing that depicts an example of an acceleration tube included in the ion implantation apparatus shown in FIG. 1 of the present invention.

FIG. 8 is a drawing that depicts an example of the acceleration tube 5 included in the ion implantation apparatus 1 shown in FIG. 1. The acceleration tube 5 includes, in the Z direction, three tubular electrodes of different electric potentials, namely, a high-voltage side electrode 16, a focusing electrode 18, and an earth-side electrode 17. An insulating glass 15 is arranged between the electrodes. An acceleration-deceleration power supply unit 19 is connected between the high-voltage side electrode 16 and the earth-side electrode 17. The energy of the ion beam 3 that passes through the acceleration tube 5 is adjusted by adjusting the acceleration-deceleration power supply unit 19. Furthermore, a focusing power supply unit 20 is connected between the high-voltage side electrode 16 and the focusing electrode 18. In the acceleration tube 5, a desired electric field is generated between the electrodes by adjusting the focusing power supply unit 20, and an arrangement is made such that the ion beam 3 that passes through the generated electric field converges or diverges. The cross-sectional size of the ion beam can be suitably adjusted in the first and second ion implantation processes using the acceleration tube 5 having the structure described above.

Figure 9:
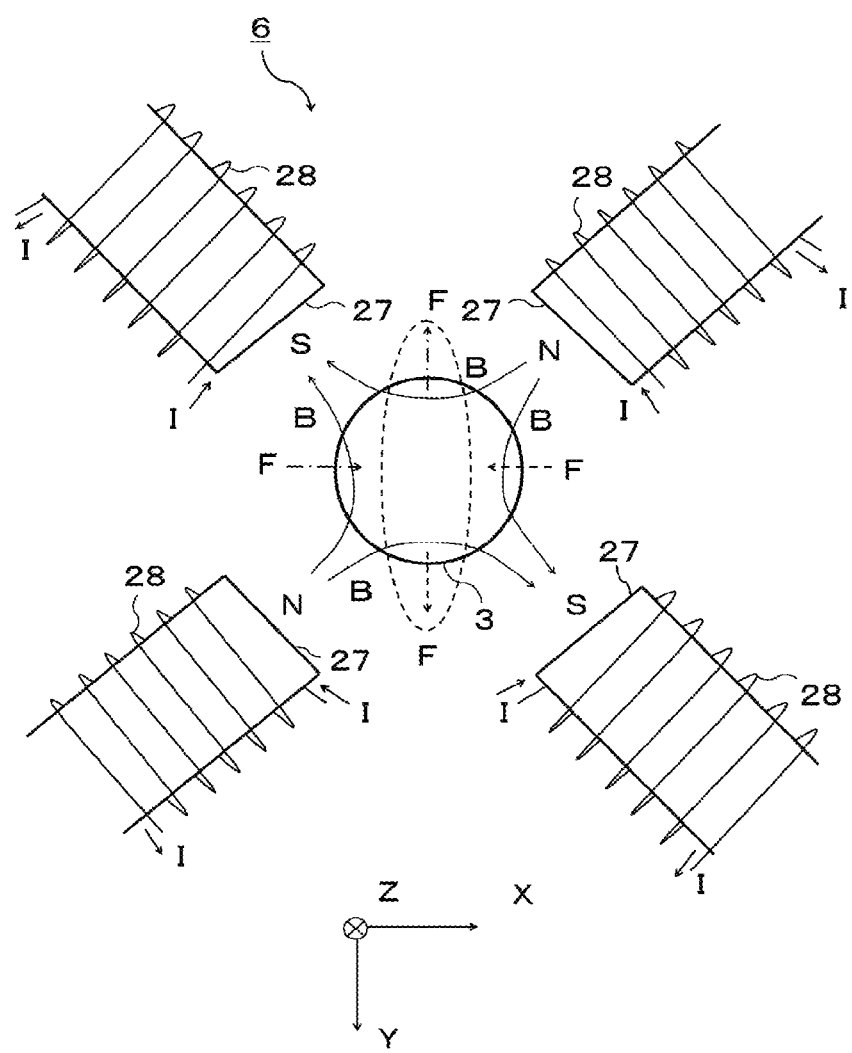
FIG. 9 is a drawing that depicts an example of a quadrupole lens included in the ion implantation apparatus shown in FIG. 1 of the present invention.

FIG. 9 is a drawing that depicts an example of the quadrupole lens 6 included in the ion implantation apparatus 1 shown in FIG. 1. The quadrupole lens 6 that uses an electromagnet is explained as an example. The quadrupole lens 6 has four magnetic poles 27 and a coil 28 is wound around each of the magnetic poles 27. An electric current I is supplied to each coil 28 and four polarities are formed at a tip of the magnetic poles 27. A magnetic field B is generated between the tips of the magnetic poles 27. A Lorentz force F is generated in the ion beam 3 that passes through the magnetic field B. In the example shown in FIG. 9, the ion beam 3 is shaped by the Lorentz force F such that it becomes shorter along the X direction and longer along the Y direction. Specifically, the shape of the ion beam 3 shown by the solid line in FIG. 9 is transformed to an elliptical shape as shown by the dashed line. The size of the ion beam 3 is reduced by removing a portion in a longitudinal direction of the ion beam 3 that is formed in the elliptical shape by the quadrupole lens 6 using the beam shaping mask 10 shown in FIG. 10. In FIG. 9, the ion beam 3 is assumed to have a positive electric charge. The quadrupole lens 6 can be an electrostatic lens instead of an electromagnetic lens shown in FIG. 9.

Figure 10A:
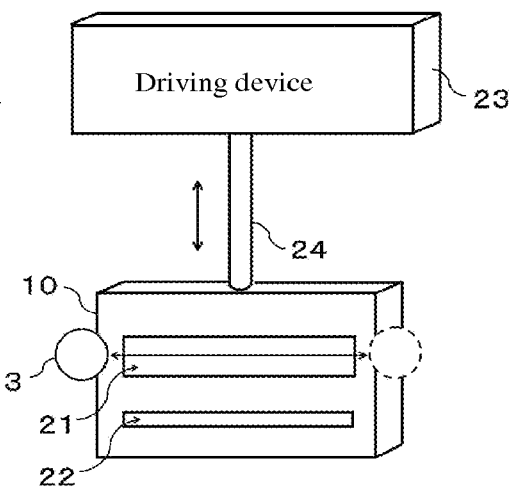
FIGS. 10A to 10C are drawings that depict examples of a beam shaping mask included in the ion implantation apparatus shown in FIG. 1 of the present invention.
Figure 10B:
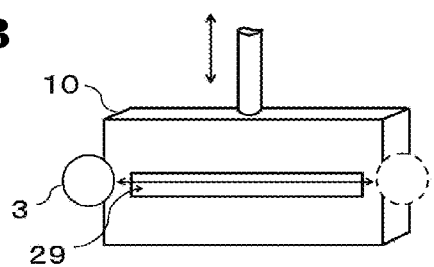
Figure 10C:
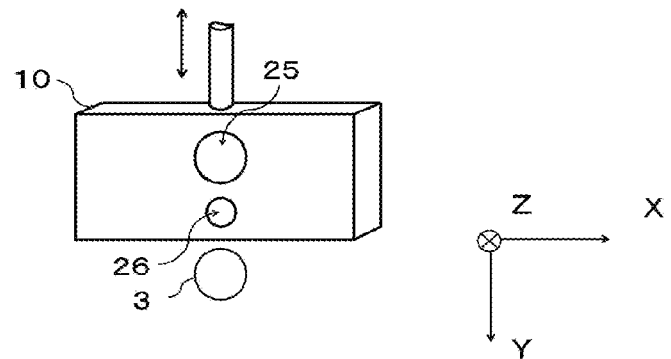
Figure 11:
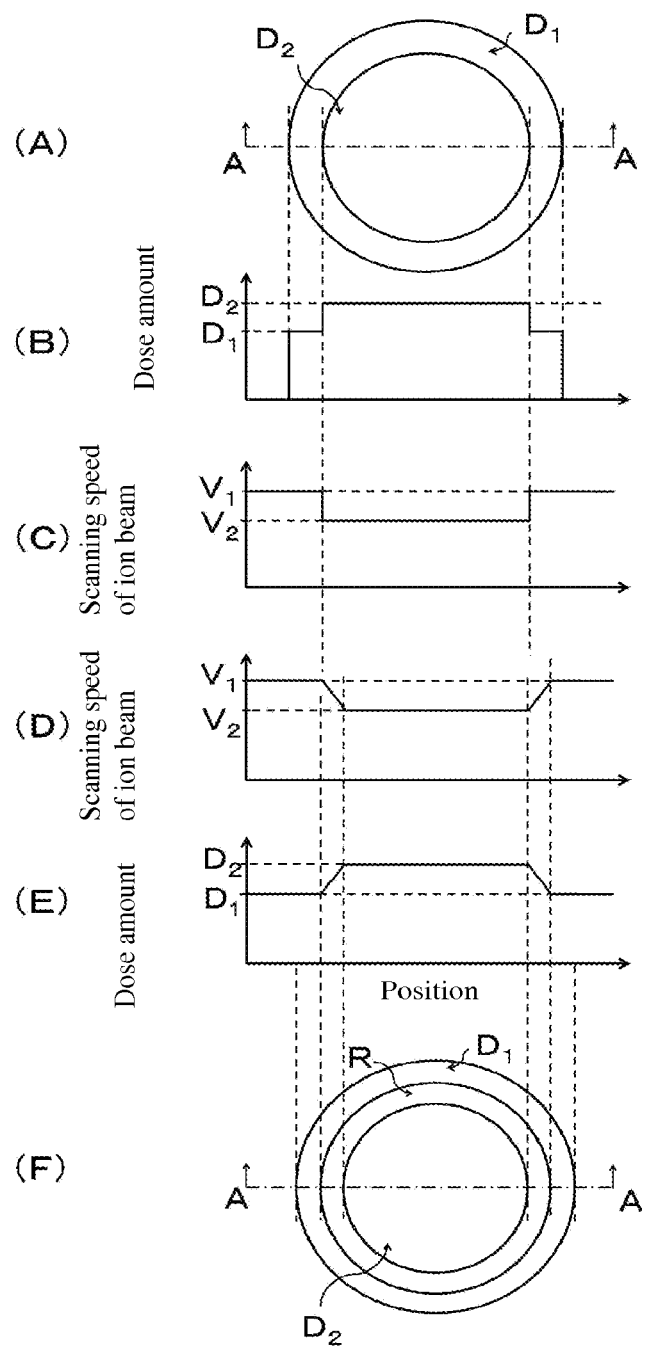
FIG. 11 depicts how a transition region is formed.

FIGS. 10A to 10C are drawings that depict examples of the beam shaping mask 10 included in the ion implantation apparatus 1 shown in FIG. 1. In FIGS. 10A to 10C, the directions of the X, Y, and Z axes are the same. A large-diameter slit 21 and a small-diameter slit 22 are provided in the beam shaping mask 10 shown in FIG. 10A. Because the beam shaping mask 10 is provided downstream of the scanner 8 (closer to the substrate 11 than the scanner 8), an opening portion provided in the beam shaping mask 10 has a slit shape that extends in a scanning direction of the ion beam 3 as shown in FIG. 10A.

In the example of FIG. 10A, an arrangement is made such that the ion beam 3 passes through the large diameter slit 21 when the first ion implantation process is performed, and through the small-diameter slit 22 when the second ion implantation process is performed. For example, the beam shaping mask 10 is connected to a shaft 24. The shaft 24 is movably supported by a driving device 23 in the Y direction. With this mechanism, a position of the beam shaping mask 10 is adjusted according to the type of the ion implantation process.

FIG. 10B is a drawing that depicts an example of the beam shaping mask 10 that includes a single slit 29. When performing the first ion implantation process, the beam shaping mask 10 is moved to a position at which the ion beam 3 is not irradiated. In this example, the beam shaping mask 10 is removed from a path of the ion beam 3 in a direction opposite to the Y direction by a driving device (not shown). Furthermore, when performing the second ion implantation process, the position of the beam shaping mask 10 is adjusted such that the ion beam 3 passes through the slit 29.

FIG. 10C is a drawing that depicts an example of the beam shaping mask 10 that has two holes. For example, the beam shaping mask 10 is arranged upstream of the scanner 8 shown in FIG. 1 (closer to the ion source 2 than the scanner 8), and the ion beam 3 is shaped before scanning. Switching between the two holes is performed similar to the example shown in FIG. 10A, that is, a large diameter hole 25 is used during the first ion implantation process and a small-diameter hole 26 is used during the second ion implantation process. Furthermore, when a single hole is used, a process similar to the example of the single slit 29 shown in FIG. 10B can be performed. The beam shaping mask 10 can be used in combination with the quadrupole lens 6 shown in FIG. 9. The beam shaping mask 10 can be used in combination with optical elements that are different from the quadrupole lens 6 included in the ion implantation apparatus 1. Furthermore, the beam shaping mask 10 can be used independently to adjust the cross-sectional size of the ion beam 3.

Other Modifications

In the embodiments described above, a method is described in which the cross-sectional size of the ion beam 3 is adjusted using the acceleration tube 5, the quadrupole lens 6, or the beam shaping mask 10; however, other methods can also be used. For example, the cross-sectional size of the ion beam 3 that is irradiated on the substrate 11 can be adjusted by adjusting various parameters of the ion source 2 (voltage applied on extracting electrodes, position, tilt of the extracting electrode, etc.).

In the embodiments described above, the ion implantation apparatus of the hybrid scanning system is described; however, the present invention is also applicable to other types of ion implantation apparatuses. For example, the present invention can be applied to an ion implantation apparatus of a raster scanning system in which the substrate 11 is fixed and an ion beam is scanned in two orthogonal directions. In this case, to form the nonuniform dose amount distribution within the substrate 11, the ion implantation apparatus can be configured such that the scanning speed of the ion beam in the two directions can be suitably adjusted according to the position on the substrate 11. Moreover, the first and second ion implantation processes that use different cross-sectional sizes of the ion beams as described in the above embodiments can be performed. Furthermore, a raster scanning system can be adopted in which instead of the substrate the ion beam is fixed, and the substrate is driven in two orthogonal directions.

An implantation mechanism having a batch system where a plurality of substrates is processed at one time can be adopted instead of an implantation mechanism having a single wafer system where the substrates are processed one by one. In this case, in the flowcharts shown in FIGS. 2, 4, and 5, a plurality of the substrates is processed together instead of one by one.

Alternatively, two ion implantation apparatuses can be used and the substrate can be continuously processed by an in-line system. For example, one ion implantation apparatus can be operated based on the operating parameters corresponding to the first ion implantation process and the other ion implantation apparatus can be operated based on the operating parameters corresponding to the second ion implantation process. Moreover, an arrangement can be made in which processing chambers of both the ion implantation apparatuses are connected and by successively transporting the substrates between the different ion implantation apparatuses without breaking vacuum, the substrates are sequentially processed.

The ion implantation apparatus of a system is described that scans the spot-like ion beam emitted from the ion source. However, the present invention can be applied to an ion implantation apparatus of a system in which a ribbon-like (substantially oblong shaped) ion beam is emitted from the ion source, expanded so as to be larger than the size of the substrate in a single plane, and irradiated on the substrate. The present invention can be applied to an ion implantation apparatus of a system in which a large ion source is prepared and a ribbon-like ion beam larger than the size of the substrate is generated in the single plane from the beginning instead of expanding the ion beam during the process.

In case of such ion implantation apparatuses, ion implantation is performed within the entire substrate along a direction that is substantially orthogonal to a spreading direction of the ion beam, that is, along a short-side direction of the ion beam that has substantially an oblong shape, by driving the substrate. In these ion implantation apparatuses, the driving speed of the substrate can be changed to form the non-uniform dose amount distribution within the substrate.

The cross-sectional shape of the ion beam that is irradiated on the substrate is almost rectangular. Therefore, the cross-sectional size of the ion beam that is irradiated on the substrate can be adjusted by the first and second ion implantation processes using the acceleration tube and the quadrupole lens, and the beam shaping mask described in the above embodiment, by controlling a width of the ribbon-like ion beam that is irradiated on the substrate in the short-side direction.

The ion implantation process can be performed in an order given below. The first ion implantation process is temporarily stopped before it ends completely and the ion implantation process is switched to the second ion implantation process. After the second ion implantation process is completed, the first ion implantation process is resumed.

Current density of the ion beam may be changed between the first ion implantation process and the second ion implantation process. In this case, current density of the ion beam in the first implantation process may be larger than current density of the ion beam in the second ion implantation process.

Apart from the modifications described above, various modifications may be made without departing from the spirit or scope of the general inventive concept as defined by the appended claims and their equivalents.

What is claimed is:

1. A method of implanting ions into a substrate while changing a relative positional relation between an ion beam and the substrate, wherein a first ion implantation process in which a uniform dose amount distribution is formed within the substrate and a second ion implantation process in which a non-uniform dose amount distribution is formed within the substrate are performed in a predetermined order, and a cross-sectional size of an ion beam that is irradiated on the substrate during the second ion implantation process is set smaller than a cross-sectional size of an ion beam that is irradiated on the substrate during the first ion implantation process.

2. The method of implanting the ions according to claim 1, wherein, when processing a plurality of substrates using the first and second ion implantation processes, one of the ion implantation processes is successively performed on the substrates, and thereafter, the other ion implantation process is successively performed on the substrates.

* * * * *